United States Patent
Chen et al.

(10) Patent No.: US 8,723,325 B2
(45) Date of Patent: May 13, 2014

(54) STRUCTURE AND METHOD OF FORMING A PAD STRUCTURE HAVING ENHANCED RELIABILITY

(75) Inventors: Hsien-Wei Chen, Sinying (TW); Ying-Ju Chen, Tuku Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 139 days.

(21) Appl. No.: 12/762,558

(22) Filed: Apr. 19, 2010

(65) Prior Publication Data
US 2010/0283149 A1 Nov. 11, 2010

Related U.S. Application Data

(60) Provisional application No. 61/175,984, filed on May 6, 2009.

(51) Int. Cl.
*H01L 23/498* (2006.01)
*H01L 21/60* (2006.01)
*H01L 33/62* (2010.01)

(52) U.S. Cl.
USPC .... 257/774; 257/737; 257/775; 257/E21.508; 257/E23.068; 257/E23.067; 257/734; 257/781; 438/614

(58) Field of Classification Search
CPC .......... H01L 24/03; H01L 24/05; H01L 24/11
USPC .......... 257/774, 737, 775, E21.508, E23.068, 257/E23.067, 734, 781; 438/614
See application file for complete search history.

(56) References Cited

U.S. PATENT DOCUMENTS

| | | | |
|---|---|---|---|
| 6,734,090 B2 * | 5/2004 | Agarwala et al. | 438/598 |
| 6,861,376 B1 * | 3/2005 | Chen et al. | 438/781 |
| 7,328,830 B2 * | 2/2008 | Bachman et al. | 228/180.21 |
| 2003/0232494 A1 * | 12/2003 | Adams et al. | 438/622 |
| 2004/0166659 A1 * | 8/2004 | Lin et al. | 438/611 |
| 2004/0198055 A1 * | 10/2004 | Wang | 438/692 |
| 2007/0145596 A1 * | 6/2007 | Chen et al. | 257/774 |
| 2008/0286962 A1 * | 11/2008 | Lee | 438/631 |

* cited by examiner

*Primary Examiner* — Tom Thomas
*Assistant Examiner* — Benjamin Tzu-Hung Liu
(74) *Attorney, Agent, or Firm* — Lowe Hauptman & Ham, LLP

(57) ABSTRACT

A semiconductor substrate is provided having a first metal layer formed over a first insulating layer. A second insulating layer is formed having a first damascene opening, the first opening having a second insulating layer portion formed therein. A resist layer is deposited to fill the first opening and the resist layer is thereafter patterned to form an etching mask for etching a second damascene opening. The second opening is etched into a portion of the second insulating layer, the second opening exposing a portion of the first metal layer. A second metal layer is formed to include filling the first and second damascene openings embedding the second insulating layer portion in the second metal layer. The second metal layer is planarized and a passivation layer is formed above the second insulating layer and the second metal layer, wherein the passivation layer partially covers the second metal layer.

28 Claims, 3 Drawing Sheets

STRUCTURE AND METHOD OF FORMING A PAD STRUCTURE HAVING ENHANCED RELIABILITY

CROSS-REFERENCE TO RELATED APPLICATIONS

The present application claims priority of U.S. Provisional Patent Application Ser. No. 61/175,984, filed on May 6, 2009, which is incorporated herein by reference in its entirety.

BACKGROUND

The disclosure relates generally to the fabrication of semiconductor bond pad structures, and more particularly, to a structure and method of forming a bond pad structure having enhanced reliability.

Semiconductor bond pad structures having bond wires and solder bump structures using flip chip technology continue to face new challenges as semiconductor device geometries continue to decrease in size. As a consequence of device miniaturization, the RC time constant of the interconnection between active circuit elements increasingly dominates the achievable chip speed-power product. One challenge is the adoption of extreme low-k (ELK) dielectric materials for use in semiconductor bond pad structures to reduce RC delay and parasitic capacitances. ELK dielectric materials generally have dielectric constant (k) values of less than about 2.5. However, as the k values decreases, as a general rule, the strength of the dielectric material decreases and these ELK materials are mechanically much weaker than the conventional silicon dioxide layers. Hence, many ELK materials are highly susceptible to cracking or lack the strength needed to withstand some mechanical processes, such as when the bond pad structure is subjected to an application of force. For example, during wire bonding tests, the overlying bond pad receives a large bonding force causing defect formation or cracking of the underlying inter-metal dielectric (IMD) layers. These wire bonding and other bonding processes induce mechanical and temperature stress in and around the bond pad, including in the conductive and dielectric layers underlying the bond pad.

These cracks may also come about when the device is subjected to thermal cycling during manufacturing, assembly, packaging, testing, and handling. Furthermore, these cracks may propagate as a result of the differences in the coefficients of thermal expansion (CTE) between different semiconductor chip materials. These cracks and peeling of various layers under the bond pad can adversely affect device performance and reliability.

For these reasons and other reasons that will become apparent upon reading the following detailed description, there is a need for an improved bond pad structure and a method of fabrication that avoids the reliability issues associated with conventional bond pad structures. The method should be low cost and use existing manufacturing equipment so that no investment in new equipment is needed.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
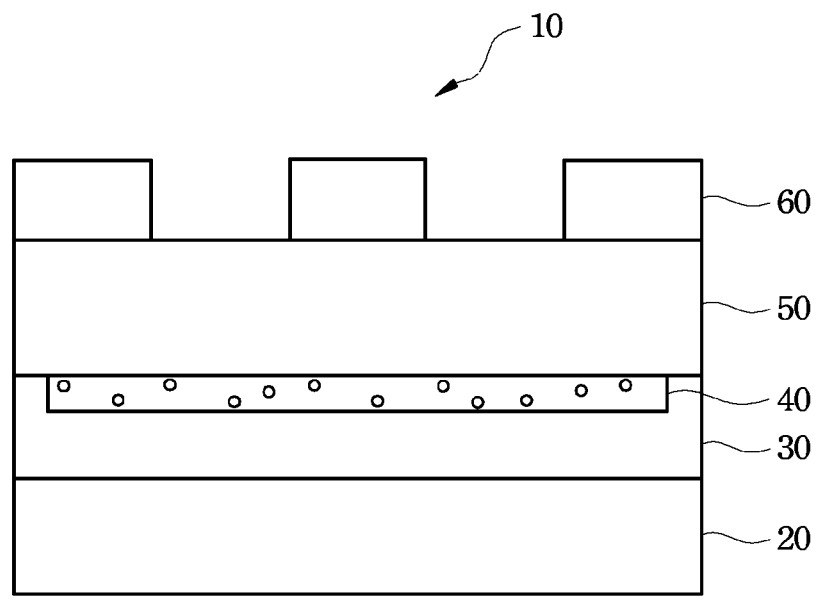
FIGS. 1-6 show cross-sectional views of a portion of a bond pad structure of a semiconductor device at various stages of manufacture according to an exemplary embodiment of the present invention.

FIG. 1 shows a cross-sectional view of a portion of a bond pad structure of a semiconductor device 10 at a stage of manufacture according to an exemplary embodiment of the present invention. The semiconductor device 10 includes a substrate 20 that may include an elementary semiconductor such as silicon, germanium, and diamond. The substrate 20 may comprise a compound semiconductor such as silicon carbide, gallium arsenic, indium arsenide, indium phosphide, or a combination of these. The substrate 20 may comprise an alloy semiconductor such as silicon germanium, silicon germanium carbide, gallium arsenic phosphide, gallium indium phosphide or a combination of these. Furthermore, the substrate 20 may comprise a semiconductor-on-insulator (SOI) structure.

As is understood by those skilled in the art, substrate 20 may include active and passive devices and various conductive layers and dielectric layers. As is shown in FIG. 1, a top metal layer or first metal layer 40 is formed over first insulating layer 30. First metal layer 40 may comprise copper, copper alloy, tungsten aluminum, or alloys thereof and is formed by conventional processes including barrier layers (not shown) lining the interface of first insulating layer 30 and first metal layer 40. First insulating layer 30 comprises a dielectric material. The dielectric material may include silicon oxide, Fluorosilicate glass (FSG), extreme low-k materials, or combinations thereof. The extreme low-k materials can be defined as a dielectric material having its dielectric constant less than about 2.5. The extreme low-k materials may comprise a silicon oxide based material having a porous structure such as carbon doped silicon oxide, organo-silicate glass (OSG), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials. The first insulating layer 30 may be formed by a Chemical Vapor Deposition (CVD) process such as, for example Low Pressure CVD (LPCVD) or Plasma Enhanced CVD (PECVD).

An etch stop layer (not shown) is then formed over portions of the first insulating layer 30 and the first metal layer 40 by conventional CVD processes, for example, LPCVD or PECVD. The etch stop layer may comprise silicon nitride (e.g., SiN, $Si_3N_4$), silicon oxynitride (SiON), silicon carbide (e.g., SiC), and other materials.

Still referring to FIG. 1, the semiconductor device 10 further comprises a second insulating layer 50 formed over first metal layer 40 and first insulating layer 30. The second insulating layer 50 is a dielectric layer that comprises a material such as for example, undoped silicate glass (USG), silicon nitride (SiN), boron doped silicate glass (BSG), phosphorous doped silicate glass (PSG), boron phosphorous doped silicate glass (BPSG), polyimides, benzocyclobutene, parylenes, diamond-like carbon, cyclotenes, fluorocarbons, methyl silsesquioxane, hydrogen silsesquioxanes, nanoporous oxides or carbon doped silicon dioxides. The second insulating layer 50 can be formed by conventional processes such as for example, CVD, Physical Vapor Deposition (PVD), or spin coating to a thickness of from about 2,000 Angstroms to about 15,000 Angstroms to allow formation of a damascene structure (e.g., dual damascene) and subsequent polishing back of the second insulating layer 50 to remove a portion of a subsequently deposited metal layer (e.g., copper/copper alloy). In other embodiments, the second insulating layer 50 can have a thickness of from about 7,000 Angstroms to about 10,000 Angstroms.

According to one embodiment of the present invention, a dual damascene structure is formed in semiconductor device 10. Dual damascene structures may be formed by several approaches, such as via-first approach, trench-first approach, buried-via approach (also called self-aligned dual-damascene), and others. According to one exemplary embodiment of the present invention, FIGS. 1-6 show the formation of a dual damascene structure in semiconductor device 10 according to a trench-first approach. It is understood by those skilled in the art, however, that the invention can be practiced by other damascene formation approaches.

Still referring to FIG. 1, a photoresist layer is coated on the semiconductor device 10 by a method such as spin-on coating. The photoresist layer is thereafter patterned to form a trench pattern by using a photomask (mask or reticle). An exemplary photolithography patterning process may also include soft baking, mask aligning, exposing pattern, post-exposure baking, resist developing, and hard baking. The photolithography patterning may also be implemented or replaced by other methods such as maskless photolithography, electron-beam writing, ion-beam writing, and molecular imprint. After development, a patterned resist layer 60 is thereafter formed as is depicted in FIG. 1.

The second insulating layer 50 is etched using the patterned resist layer 60 as a trench mask to transfer the trench pattern to the second insulating layer 50. The insulating layer 50 may be etched by dry etching using conventional dry (e.g., reactive ion etch, or RIE) etching chemistries, for instance. For example, an etching chemistry including fluorocarbons and/or perfluorocarbons together with oxygen, and optionally nitrogen, may be used in the dry etchback process.

Figure 2:
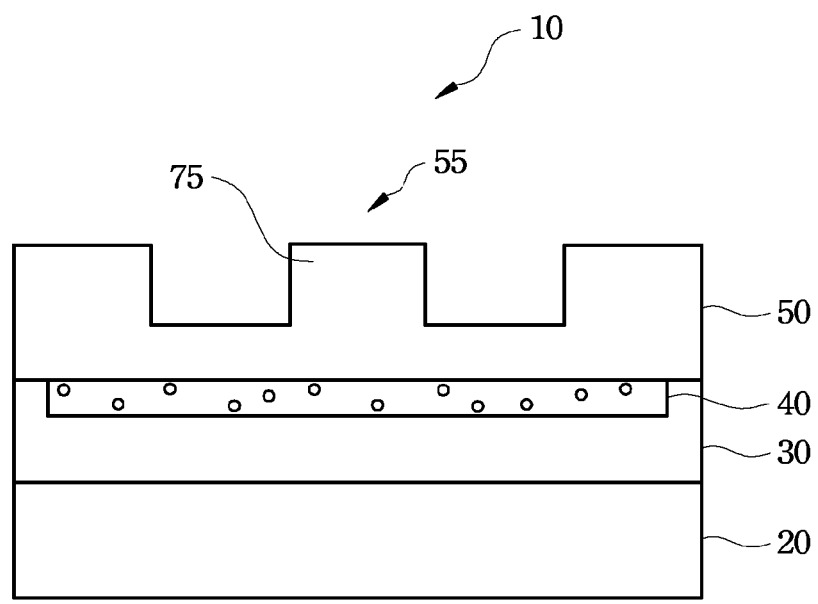

Following the removal of the patterned resist layer 60 by a conventional wet stripping and/or a dry ashing process, for example a patterned second insulating layer 50 having a first damascene opening or trench opening 55 is formed and shown in FIG. 2. In accordance with the pattern formed in the photomask, the trench opening 55 has a second insulating layer portion 75 formed therein. According to one embodiment of the present invention, the second insulating layer portion 75 is formed substantially in the middle of the trench opening 55. As will be explained further below, forming the second insulating layer portion 75 substantially in the middle of the trench opening 55 allows the second insulating layer portion 75 to better act as a stress buffer and therefore resist cracking and peeling when semiconductor device 10 undergoes bonding, manufacturing, assembling, and testing processes. In other embodiments, the second insulating layer portion 75 is formed off-center from the middle of the trench opening 55.

A second photoresist layer is deposited on patterned second insulating layer 50 to include filling the trench opening 55 and patterned to form via patterns by using a via photomask (mask or reticle) overlying the trench opening 55. The via photomask is aligned to, and adjacent to, the second insulating layer portion 75 for forming the via patterns. An exemplary photolithography patterning process may also include soft baking, mask aligning, exposing pattern, post-exposure baking, resist developing, and hard baking. The photolithography patterning may also be implemented or replaced by other proper methods such as maskless photolithography, electron-beam writing, ion-beam writing, and molecular imprint.

Figure 3:
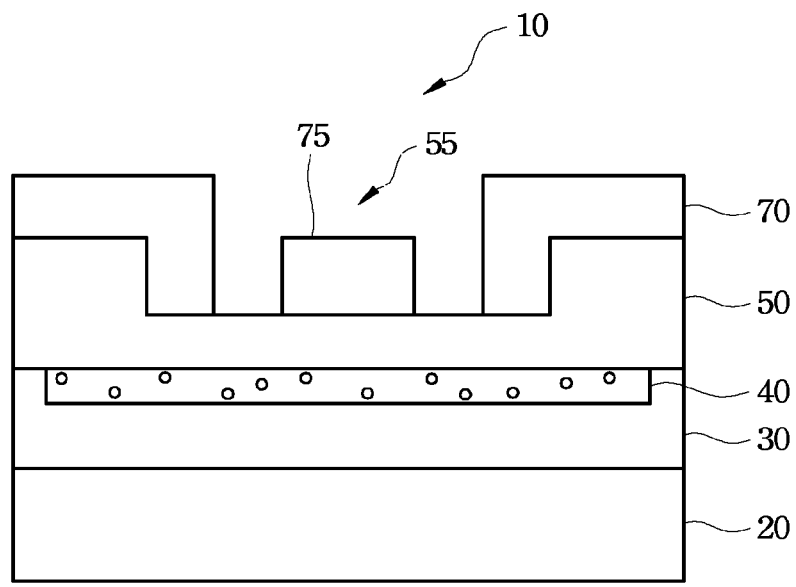

As is shown in FIG. 3, following a development step, a second patterned resist layer 70 is formed on semiconductor device 10. According to one embodiment, the second insulating layer 50 is thereafter etched using the patterned resist layer 70 as a via mask in alignment to, and adjacent to, the second insulating layer portion 75 in order to transfer the via pattern to the second insulating layer 50. The second insulating layer 50 is etched down to expose a portion of the first metal layer 40. The second insulating layer 50 may be etched by dry etching using conventional dry (e.g., RIE) etching chemistries. For example, an etching chemistry including fluorocarbons and/or perfluorocarbons together with oxygen, and optionally nitrogen, is preferably used in the dry etchback process.

Figure 4:
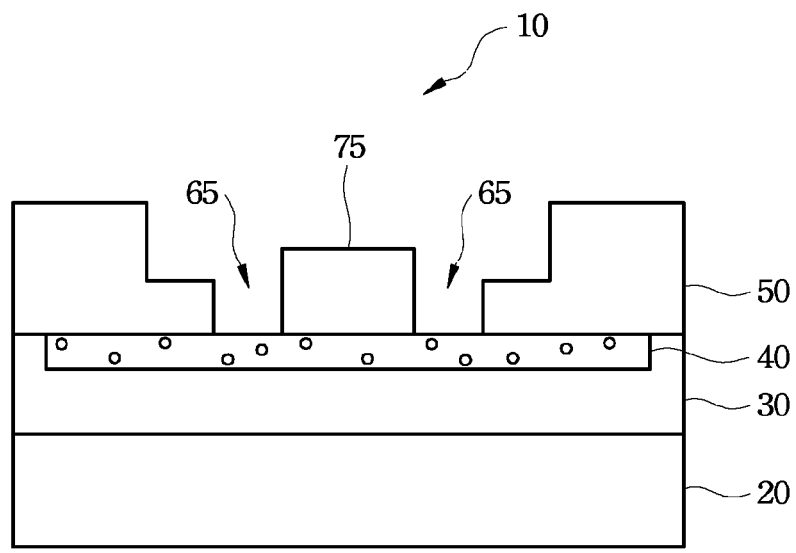

Following the removal of the second patterned resist layer 70 by a conventional wet stripping and/or a dry ashing process, a patterned second insulating layer 50 having a trench opening 55 and a second damascene opening or via opening 65 shown on either side of the second insulating layer portion 75 is formed and illustrated in FIG. 4.

Figure 5:
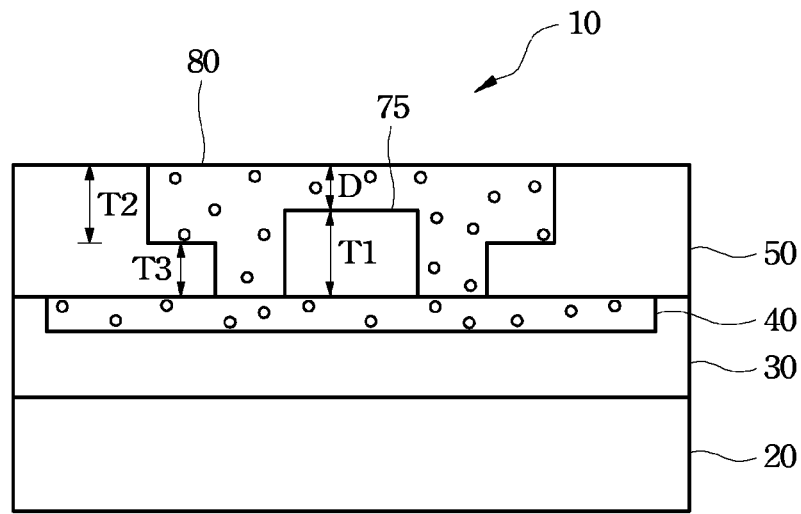

With reference now to FIG. 5, prior to depositing a copper layer to fill the damascene openings, in other words, the trench opening 55 and the via openings 65, a barrier layer (not shown) is deposited to line the damascene openings. The barrier layer may be deposited by a PECVD process and comprise a refractory metal such as, for example Ta, TaN, Ti, TiN, WN, Cr, CrN, TaSiN, TiSiN, and WSiN. Following the formation of the barrier layer, a copper seed layer (not shown) may then be deposited over the barrier layer by a PVD or CVD process, for example. A metal filling process, for example an electrochemical plating (ECP) process is then carried out to blanket deposit a second metal layer 80 to fill the damascene openings and embed the second insulating layer portion 75 in the second metal layer 80. The second metal layer 80 may comprise copper, copper alloy, tungsten aluminum, or alloys thereof. It is understood that the copper bond pad comprises the first metal layer 40 and the second metal layer 80. By embedding the second insulating layer portion 75 in a damascene structure and in the copper bond pad (first metal layer 40 and second metal layer 80), the second insulating layer portion 75 acts as a stress buffer. The semiconductor device 10 having this stress buffer is better able to withstand the stresses and thermal cycling that comes from bonding, manufacturing, assembling, packaging, handling, and testing processes and is therefore better able to resist cracks and peeling that may develop at the various layers under the bond pad.

Following copper ECP deposition, a conventional planarization process, for example Chemical Mechanical Polishing (CMP), is carried out to remove the excess portion of the second metal layer 80 above the top of the damascene trench level. In one embodiment of the present invention, following the planarization process, the thickness T1 of the second insulating layer portion 75 substantially equals the thickness T2 of the trench opening 55. This, however, does not take into account the thickness of the etch stop layer. In another embodiment, the thickness T3 of the via opening 65 equals substantially the distance D, measured from the top of the second insulating layer portion 75 to the top of the planarized second metal layer 80. In some other embodiments, the distance D is larger than the thickness T3.

Where formation of a solder bump is desired on the semiconductor device 10, the process continues from the step shown in FIG. 5. A passivation layer 90 is deposited on semiconductor device 10 above the second insulating layer 50 and the second metal layer 80. Following patterning and development by conventional photolithographic processes, passivation layer 90 has an opening formed therein exposing a portion of second metal layer 80, in other words the contact pad. Passivation layer 90 may be comprised of a material, such as undoped silicate glass (USG), silicon nitride (SiN), silicon dioxide ($SiO_2$), and silicon oxynitride (SiON). In one embodiment, passivation layer 90 has a thickness of from about 1,500 Angstroms to about 15,000 Angstroms. In other embodiments, passivation layer 90 has a thickness of from about 6,000 Angstroms to about 10,000 Angstroms. Second metal layer 80 establishes electrical contact between the electrical interconnects (not shown) in substrate 20 to a later-to-be-formed overlying solder bump.

Figure 6:
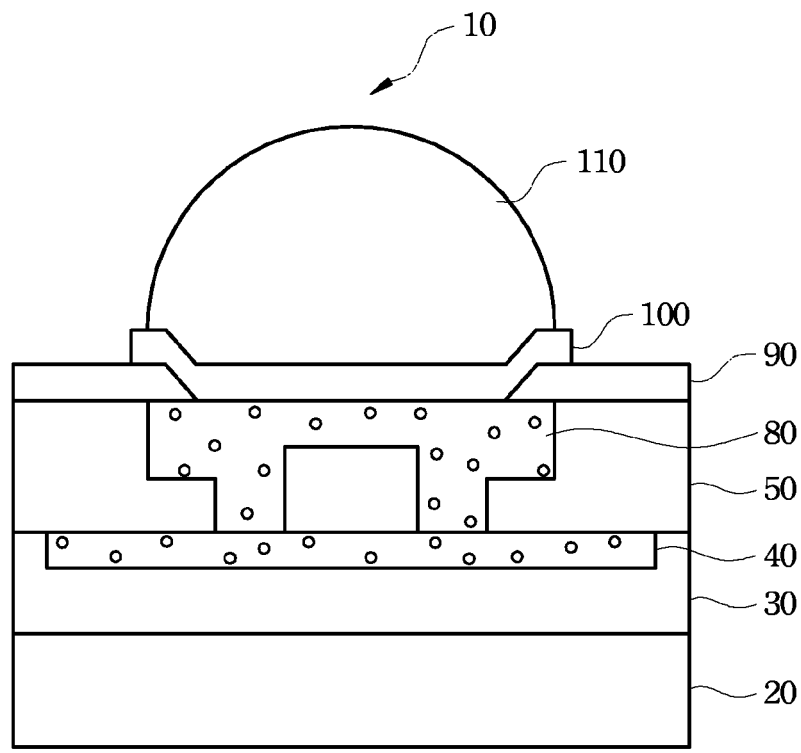

Following the formation of passivation layer 90 on substrate 20 exposing a portion of the second metal layer 80, a plurality of UBM (under bump metallurgy) layers 100 are then deposited. UBM layers 100 are deposited by methods such as sputtering, vapor deposition, electroless plating, or electroplating, over portions of the passivation layer 90 and second metal layer 80, to allow for better bonding and wetting of a later-to-be-deposited solder material to the uppermost UBM layer. Following patterning and etching by conventional photolithographic processes, the patterned and etched UBM layers 100 are shown in FIG. 6. A solder bump 110 is then formed on the UBM layers 100 by reflowing the solder material.

Where it is desired to attach the semiconductor device 10 to another microelectronic device, such as a die package, by way of a bond wire (not shown), a conductive layer (e.g., aluminum) (not shown) is formed over the passivation layer 90 and the bond wire is attached to the conductive layer. The bond wire may be bonded to the conductive layer by a bonding process, such as ultrasonic wedge bonding or the like.

An advantage of some embodiments of the present invention is that the bond pad structure can be made mechanically stronger and more robust than conventional bond pad structures using ELK dielectric layers. By embedding the USG second insulating layer portion 75 in a USG damascene structure and in the copper bond pad (first metal layer 40 and second metal layer 80), the USG second insulating layer portion 75 acts as a stress buffer. The bond pad structure having this stress buffer is better able to withstand the stresses and thermal cycling that comes from bonding, manufacturing, assembling, packaging, handling, and testing processes and is therefore better able to resist cracks and peeling that may develop at the various layers under the bond pad.

Another advantage of embodiments of the present invention is that the method of forming bond pad structures can be practiced using existing manufacturing equipment so that no investment in new equipment is needed.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of forming an integrated circuit structure, comprising:
   forming a first metal layer over a first insulating layer of a substrate;
   forming a continuous second patterned insulating layer over the substrate, the second patterned insulating layer having a damascene opening therein exposing a portion of the first metal layer, the damascene opening having a second insulating layer portion formed therein, the second insulating layer portion having a width between a first side portion and a second side portion, the first side portion and second side portion being parallel, the second insulating layer portion also having a top side portion extending from the first side portion to the second side portion, the top side portion having a continuous length equal to the width of the second insulating layer portion, the damascene opening having a trench opening and a via opening of a dual damascene structure and the second insulating layer portion extending through the via opening into the trench opening causing the top side portion to be above the trench opening;
   filling the damascene opening with a second metal layer to embed the second insulating layer portion in the second metal layer; and
   forming a passivation layer above the second patterned insulating layer and the second metal layer, wherein the passivation layer partially covers the second metal layer.

2. The method of claim 1, wherein the second insulating layer is a material selected from the group consisting of undoped silicate glass (USG), silicon nitride (SiN), boron doped silicate glass (BSG), phosphorous doped silicate glass (PSG), boron phosphorous doped silicate glass (BPSG), polyimides, benzocyclobutene, parylenes, diamond-like carbon, cyclotenes, fluorocarbons, methyl silsesquioxane, hydrogen silsesquioxanes, nanoporous oxides or carbon doped silicon dioxides, and combinations thereof.

3. The method of claim 1, wherein the second insulating layer portion has a thickness of from about 2,000 Angstroms to about 15,000 Angstroms.

4. The method of claim 1, wherein the second metal layer is a material selected from the group consisting of copper, copper alloy, tungsten aluminum, and alloys thereof.

5. The method of claim 1, further comprising planarizing the second metal layer prior to forming the passivation layer.

6. The method of claim 5, further comprising:
   forming a conductive layer over the passivation layer; and
   attaching a bond wire to the conductive layer.

7. The method of claim 6, wherein the conductive layer comprises aluminum.

8. The method of claim 1, further comprising:
   forming an under bump metallurgy layer over the passivation layer, the under bump metallurgy layer in contact with the second metal layer; and forming a solder bump on the under bump metallurgy layer, wherein the solder bump partially covers the under bump metallurgy layer.

9. The method of claim 1, wherein forming the continuous second patterned insulating layer over the substrate comprises forming the second insulating layer portion off center with respect to the damascene opening.

10. A method of forming an integrated circuit structure, comprising:
providing a semiconductor substrate having a first metal layer formed over a first insulating layer;
forming a second insulating layer having a first damascene opening, the first damascene opening having a portion of the second insulating layer formed therein, the second insulating layer portion having a width between a first side portion and a second side portion, the first side portion and second side portion being parallel, the second insulating layer portion also having a top side portion extending from the first side portion to the second side portion, the top side portion having a continuous length equal to the width of the second insulating layer portion, and the second insulating layer portion being off-center with respect to the damascene opening;
depositing a resist layer to fill the first damascene opening and patterning the resist layer to form an etching mask for etching a second damascene opening;
etching the second damascene opening into a portion of the second insulating layer, the second damascene opening exposing a portion of the first metal layer, wherein the second insulating layer portion extends through the second damascene opening into the first damascene opening causing the top side portion to be above the first damascene opening;
forming a second metal layer to include filling the first and second damascene openings to embed the second insulating layer portion in the second metal layer;
planarizing the second metal layer; and
forming a passivation layer above the second insulating layer and the second metal layer, wherein the passivation layer partially covers the second metal layer.

11. The method of claim 10, wherein the second insulating layer is a material selected from the group consisting of undoped silicate glass (USG), silicon nitride (SiN), boron doped silicate glass (BSG), phosphorous doped silicate glass (PSG), boron phosphorous doped silicate glass (BPSG), polyimides, benzocyclobutene, parylenes, diamond-like carbon, cyclotenes, fluorocarbons, methyl silsesquioxane, hydrogen silsesquioxanes, nanoporous oxides or carbon doped silicon dioxides, and combinations thereof.

12. The method of claim 10, wherein the second insulating portion has a thickness of from about 2,000 Angstroms to about 15,000 Angstroms.

13. The method of claim 10, wherein the first damascene opening comprises a trench opening and the second damascene opening comprises a via opening of a damascene structure.

14. The method of claim 13, wherein the thickness of the second insulating layer portion substantially equals the thickness of the trench opening.

15. The method of claim 13, wherein the thickness of the via opening substantially equals the distance from the top of the second insulating layer portion to the planarized second metal layer.

16. The method of claim 10, wherein the second damascene opening is formed to a depth greater in the second insulating layer than the first damascene opening.

17. The method of claim 10, wherein the second metal layer is a material selected from the group consisting of copper, copper alloy, tungsten aluminum, and alloys thereof.

18. The method of claim 10, wherein the etching the second damascene opening is adjacent to the second insulating layer portion.

19. The method of claim 10, further comprising:
forming an under bump metallurgy layer over the passivation layer, the under bump metallurgy layer in contact with the second metal layer; and
forming a solder bump on the under bump metallurgy layer, wherein the solder bump partially covers the under bump metallurgy layer.

20. The method of claim 10, further comprising:
forming a conductive layer over the passivation layer, the conductive layer in contact with the second metal layer; and
attaching a bond wire to the conductive layer.

21. The method of claim 20, wherein the conductive layer comprises aluminum.

22. An integrated circuit structure, comprising:
a first metal layer formed over a first insulating layer of a substrate;
a continuous second insulating layer formed over the substrate, the second insulating layer having a damascene opening therein exposing a portion of the first metal layer, the damascene opening including a second insulating layer portion formed therein, the second insulating layer portion having a width between a first side portion and a second side portion, the first side portion and second side portion being parallel, the second insulating layer portion also having a top side portion extending from the first side portion to the second side portion, the top side portion having a continuous length equal to the width of the second insulating layer portion, the damascene opening having a trench opening and a via opening of a damascene structure and the second insulating layer portion extending through the via opening into the trench opening causing the top side portion to be above the trench opening, wherein the damascene opening is filled with a second metal layer embedding the second insulating layer portion in the second metal layer; and
a passivation layer formed above the second insulating layer and the second metal layer, wherein the passivation layer partially covers the second metal layer.

23. The integrated circuit structure of claim 22, wherein the second insulating layer is a material selected from the group consisting of undoped silicate glass (USG), silicon nitride (SiN), boron doped silicate glass (BSG), phosphorous doped silicate glass (PSG), boron phosphorous doped silicate glass (BPSG), polyimides, benzocyclobutene, parylenes, diamond-like carbon, cyclotenes, fluorocarbons, methyl silsesquioxane, hydrogen silsesquioxanes, nanoporous oxides or carbon doped silicon dioxides, and combinations thereof.

24. The integrated circuit structure of claim 22, wherein the second insulating layer portion has a thickness of from about 2,000 Angstroms to about 15,000 Angstroms.

25. The integrated circuit structure of claim 22, wherein the second metal layer is a material selected from the group consisting of copper, copper alloy, tungsten aluminum, and alloys thereof.

26. The integrated circuit structure of claim 22, further comprising:
an under bump metallurgy layer formed over the passivation layer, the under bump metallurgy layer in contact with the second metal layer; and a solder bump formed on the under bump metallurgy layer, wherein the solder bump partially covers the under bump metallurgy layer.

27. The integrated circuit structure of claim 22, further comprising:
a conductive layer formed over the passivation layer; and
a bond wire attached to the conductive layer.

28. The integrated circuit structure of claim 22, wherein the second insulating layer portion off center with respect to the damascene opening.

* * * * *